United States Patent
Kameyama et al.

(10) Patent No.: US 7,646,100 B2
(45) Date of Patent: Jan. 12, 2010

(54) SEMICONDUCTOR DEVICE WITH PENETRATING ELECTRODE

(75) Inventors: Kojiro Kameyama, Gunma (JP); Akira Suzuki, Gunma (JP); Mitsuo Umemoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 64 days.

(21) Appl. No.: 11/260,682

(22) Filed: Oct. 28, 2005

(65) Prior Publication Data
US 2006/0108691 A1    May 25, 2006

(30) Foreign Application Priority Data
Oct. 28, 2004  (JP)  ............... 2004-313733

(51) Int. Cl.
    *H01L 23/48*    (2006.01)
(52) U.S. Cl. ............... 257/774; 257/621; 257/758; 257/E21.575
(58) Field of Classification Search ......... 257/621, 257/774, 758, E21.575, 627
    See application file for complete search history.

(56) References Cited

U.S. PATENT DOCUMENTS

| | | | |
|---|---|---|---|
| 4,097,890 A | | 6/1978 | Morris et al. |
| 4,964,212 A | * | 10/1990 | Deroux-Dauphin et al. ... 29/852 |
| 5,056,216 A | | 10/1991 | Madou et al. |
| 5,122,856 A | * | 6/1992 | Komiya ............... 257/774 |
| 5,149,674 A | * | 9/1992 | Freeman et al. ............ 438/612 |
| 5,229,647 A | | 7/1993 | Gnadinger |
| 5,248,903 A | * | 9/1993 | Heim .................. 257/748 |
| 5,284,797 A | | 2/1994 | Heim |
| 5,397,907 A | | 3/1995 | Lee |
| 5,432,119 A | | 7/1995 | Le et al. |
| 5,502,337 A | * | 3/1996 | Nozaki .................. 257/773 |

(Continued)

FOREIGN PATENT DOCUMENTS

EP    1376678 A2    1/2004

(Continued)

OTHER PUBLICATIONS

Microchip Fabrication, Peter Van Zant, McGraw-Hill, Fourth Edition, pp. 402-403.

(Continued)

*Primary Examiner*—Eugene Lee
(74) *Attorney, Agent, or Firm*—Morrison & Foerster LLP (57) ABSTRACT

The first pad electrode layer is disposed on the surface of the semiconductor substrate with the first insulating film between them. Then, the second insulating film with the first via hole partially exposing the first pad electrode layer is formed over the first pad electrode layer. The plug is formed in the first via hole in the next process. The second pad electrode layer connected to the plug is disposed on the second insulating film. Next, the second via hole reaching to the first pad electrode layer from the backside of the semiconductor substrate is formed. The penetrating electrode and the second wiring layer connected to the first pad electrode layer at the bottom part of the second via hole are disposed. Furthermore, the protecting layer and the conductive terminal are formed. Finally, the semiconductor substrate is diced into the semiconductor chips.

6 Claims, 10 Drawing Sheets

U.S. PATENT DOCUMENTS

| | | | |
|---|---|---|---|
| 5,700,735 A * | 12/1997 | Shiue et al. | 438/612 |
| 5,739,587 A | 4/1998 | Sato | |
| 5,910,687 A | 6/1999 | Chen et al. | |
| 5,915,167 A * | 6/1999 | Leedy | 438/108 |
| 5,949,140 A * | 9/1999 | Nishi et al. | 257/728 |
| 5,985,749 A | 11/1999 | Lin et al. | |
| 6,020,217 A | 2/2000 | Kuisl et al. | |
| 6,031,293 A | 2/2000 | Hsuan et al. | |
| 6,137,129 A * | 10/2000 | Bertin et al. | 257/302 |
| 6,204,074 B1 * | 3/2001 | Bertolet et al. | 438/18 |
| 6,242,813 B1 * | 6/2001 | Huang et al. | 257/784 |
| 6,281,448 B1 | 8/2001 | Tsukamoto | |
| 6,297,563 B1 * | 10/2001 | Yamaha | 257/781 |
| 6,323,546 B2 * | 11/2001 | Hsuan et al. | 257/686 |
| 6,391,770 B2 * | 5/2002 | Kosaki et al. | 438/650 |
| 6,562,709 B1 | 5/2003 | Lin | |
| 6,642,615 B2 | 11/2003 | Hashimoto et al. | |
| 6,716,737 B2 * | 4/2004 | Plas et al. | 438/612 |
| 6,720,661 B2 * | 4/2004 | Hanaoka et al. | 257/774 |
| 6,734,568 B2 * | 5/2004 | Matsuo et al. | 257/781 |
| 6,746,953 B2 | 6/2004 | Kramer et al. | |
| 6,768,205 B2 | 7/2004 | Taniguchi et al. | |
| 6,773,952 B2 * | 8/2004 | Armbrust et al. | 438/54 |
| 6,838,362 B2 * | 1/2005 | Mastromatteo et al. | 438/524 |
| 6,943,442 B2 * | 9/2005 | Sunohara et al. | 257/700 |
| 7,045,896 B2 | 5/2006 | Ahn | |
| 7,094,701 B2 | 8/2006 | Umemoto et al. | |
| 7,101,735 B2 * | 9/2006 | Noma et al. | 438/114 |
| 7,114,251 B2 | 10/2006 | Mashino | |
| 7,214,615 B2 * | 5/2007 | Miyazawa | 438/667 |
| 7,247,939 B2 | 7/2007 | Huang et al. | |
| 7,339,273 B2 | 3/2008 | Kameyama et al. | |
| 2002/0025587 A1 | 2/2002 | Wada | |
| 2003/0025173 A1 | 2/2003 | Suminoe et al. | |
| 2003/0045085 A1 | 3/2003 | Taniguchi et al. | |
| 2003/0137056 A1 | 7/2003 | Taniguchi et al. | |
| 2003/0160293 A1 | 8/2003 | Iadanza | |
| 2003/0230805 A1 | 12/2003 | Noma et al. | |
| 2004/0016942 A1 | 1/2004 | Miyazawa et al. | |
| 2004/0017419 A1 | 1/2004 | Lai et al. | |
| 2004/0045668 A1 | 3/2004 | Iwasaki et al. | |
| 2004/0072413 A1 | 4/2004 | Hashimoto et al. | |
| 2004/0104485 A1 | 6/2004 | Yokoyama | |
| 2004/0137701 A1 | 7/2004 | Takao | |
| 2004/0137723 A1 | 7/2004 | Noma et al. | |
| 2004/0140563 A1 | 7/2004 | Ahn | |
| 2004/0188807 A1 | 9/2004 | Hiraoka et al. | |
| 2004/0251554 A1 | 12/2004 | Masuda | |
| 2005/0003649 A1 | 1/2005 | Takao | |
| 2005/0023700 A1 * | 2/2005 | Singh et al. | 257/773 |
| 2005/0167812 A1 | 8/2005 | Yoshida et al. | |
| 2005/0189637 A1 | 9/2005 | Okayama et al. | |
| 2006/0033168 A1 | 2/2006 | Umemoto et al. | |
| 2006/0087042 A1 | 4/2006 | Kameyama et al. | |
| 2006/0108695 A1 | 5/2006 | Kameyama et al. | |
| 2006/0202348 A1 | 9/2006 | Kameyama et al. | |
| 2007/0249158 A1 | 10/2007 | Okayama et al. | |
| 2008/0132038 A1 | 6/2008 | Kameyama et al. | |
| 2009/0124078 A1 | 5/2009 | Kameyama et al. | |

FOREIGN PATENT DOCUMENTS

| | | | |
|---|---|---|---|
| EP | 1376678 A3 | 1/2004 | |
| EP | 1408547 | 4/2004 | |
| EP | 1439576 | 7/2004 | |
| EP | 1 564 805 A1 | 8/2005 | |
| EP | 1 564 810 | 8/2005 | |
| EP | 1564806 | 8/2005 | |
| EP | 1653508 | 5/2006 | |
| JP | 2002-512436 A1 | 4/2002 | |
| JP | 2002-348697 | 12/2002 | |
| JP | 2003-309221 | 10/2003 | |
| JP | 2004-296488 | 10/2004 | |
| JP | 2005-5322 | 1/2005 | |
| JP | 2005-183548 | 7/2005 | |
| JP | 2005-268456 | 9/2005 | |
| WO | WO 96/13062 A1 | 5/1996 | |
| WO | WO 99/40624 A1 | 8/1999 | |
| WO | WO 2004/064159 | 7/2004 | |

OTHER PUBLICATIONS

European Office Action, dated Jul. 11, 2008, directed to related European Patent Application No. 05002897.6; (5 pages).

European Search Report, dated Apr. 24, 2009, directed to related European Patent Application No. 05023408.7; (5 pages).

European Search Report, dated May 8, 2009, directed to related European Patent Application No. 05023409.5; (5 pages).

Kameyama et al., US Office Action mailed May 14, 2008, directed to related application U.S. Appl. No. 11/257,406; (6 pages).

Kameyama et al., US Office Action mailed Nov. 13, 2008, directed to related U.S. Appl. No. 11/257,406; (9 pages).

Kameyama et al., US Office Action mailed Apr. 16, 2007, directed to related application U.S. Appl. No. 11/257,390; (11 pages).

Kameyama et al., US Office Action mailed Apr. 23, 2009, directed to related application U.S. Appl. No. 11/969,065; (7 pages).

Okayama et al., US Office Action mailed Jun. 29, 2006, directed to related application U.S. Appl. No. 11/055,707; (6 pages).

Okayama et al., US Office Action mailed Nov. 21, 2006, directed to related application U.S. Appl. No. 11/055,707; (10 pages).

Okayama et al., US Office Action mailed Aug. 9, 2007, directed to related application U.S. Appl. No. 11/055,707; (15 pages).

Okayama et al., US Office Action mailed Jan. 28, 2008 directed to related application U.S. Appl. No. 11/055,707; (15 pages).

Okayama et al., US Office Action mailed Sep. 3, 2008, directed to related application U.S. Appl. No. 11/055,707; (15 pages).

Okayama et al., US Office Action mailed Feb. 6, 2009, directed to related application U.S. Appl. No. 11/055,707; (19 pages).

Okayama et al., US Office Action mailed May 1, 2008, directed to related application U.S. Appl. No. 11/808,667; (10 pages).

Okayama et al., US Office Action mailed Oct. 10, 2008, directed to related application U.S. Appl. No. 11/808,667; (10 pages).

Okayama et al., US Office Action mailed Feb. 13, 2009, directed to related application U.S. Appl. No. 11/808,667; (12 pages).

Kameyama et al., US Office Action mailed Dec. 31, 2007, directed to related application U.S. Appl. No. 11/362,503; (8 pages).

Kameyama et al., US Office Action mailed Jun. 8, 2009, directed to related application U.S. Appl. No. 12/346,667; (12 pages).

EP Search Report dated Aug. 4, 2009, directed to Application No. 05023591.0 (10 pages).

EP Search Report dated Jul. 10, 2009, directed to Application No. 05023408.7 (10 pages).

Okayama et al., US Office Action mailed Aug. 3, 2009, directed to related U.S. Appl. No. 11/055,707; (11 pages).

Okayama et al., U.S Office Action mailed on Jul. 9, 2009 directed to U.S. Appl. No. 11/808,667;11 pages.

European Search Report, dated Jun. 25, 2009, directed to European Patent Application No. 06 00 4779.2; 8 pages.

Okayama, Y. et al. U.S. Office Action mailed Sep. 1, 2009, directed to a related U.S. Appl. No. 11/808,667; 11 pages.

* cited by examiner

SEMICONDUCTOR DEVICE WITH PENETRATING ELECTRODE

CROSS-REFERENCE OF THE INVENTION

This invention is based on Japanese Patent Application No. 2004-313733, the content of which is incorporated by reference in its entirety.

BACKGROUND OF THE INVENTION

1. Field of the Invention

This invention relates to a semiconductor device and its manufacturing method, especially to a semiconductor device with a penetrating electrode and its manufacturing method.

2. Description of the Related Art

Chip size package (referred to as CSP hereinafter) has recently been gathering attention as a three-dimensional packaging technology and as a new packaging technology. CSP is a small package with the outside dimensions almost the same as those of a semiconductor chip.

A BGA (Ball Grid Array) type semiconductor device with a penetrating electrode has been known as a CSP. The BGA type semiconductor device has a penetrating electrode connected with a pad electrode piercing through a semiconductor substrate. This type of semiconductor device has a plurality of conductive terminals disposed in a matrix configuration with a ball-shape, and made of metal such as welding on the backside of the device.

Each of the conductive terminals is connected to a wiring pattern on a circuit substrate (for example, a print substrate) when the semiconductor device is built into an electronic device. The BGA type semiconductor device has an advantage, because the device can accommodate a plurality of conductive terminals, leading to a minimization of the size, unlike other CSP type semiconductor device such as SOP (small outline package) or QFP (quad flat package) that has a lead pin protruding from side surface.

Next, the manufacturing method of the BGA type semiconductor device with the penetrating electrode of prior arts will be explained. A pad electrode is formed on a semiconductor substrate with a first insulating film between them. Next, a via hole reaching the pad electrode from the backside of the semiconductor device is formed by etching the semiconductor substrate. Then, a second insulating film exposing the pad electrode at the bottom of the via hole is disposed on the backside of the semiconductor device including the inside of the via hole.

A penetrating electrode electrically connected to the pad electrode that is exposed at the bottom of the via hole is formed on the second insulating film inside of the via hole. A wiring layer connected to the penetrating electrode is simultaneously formed on the second insulating film formed at the backside of the semiconductor substrate. Then, a protecting film is disposed at the backside of the semiconductor substrate including the wiring layer and a part of the protecting film is opened up to expose a part of the wiring layer. It is possible to further form conductive terminals on the wiring layer. Then, the semiconductor substrate is cut into a plurality of semiconductor chips through dicing. The related technology is disclosed, for example, in Japanese Patent Application Publication No. 2003-309221.

SUMMARY OF THE INVENTION

The invention provides a semiconductor device that includes a semiconductor chip comprising a first insulating film disposed on the front surface, a first pad electrode layer disposed on part of the first insulating film, a second insulating film disposed on the first pad electrode layer and having a first via hole, a second pad electrode layer disposed on the second insulating film, a metal plug disposed in first via hole and electrically connecting the first and second electrode layers, a penetrating electrode disposed in a second via hole and electrically connected with the first pad electrode layer. The second via hole is formed from the back surface of the semiconductor chip toward the first pad electrode layer.

The invention also provides a method of manufacturing a semiconductor device. The method includes providing a semiconductor substrate having a first insulating film disposed on the front surface, forming a first pad electrode layer on the first insulating film, forming a second insulating film on the first pad electrode layer, forming a first via hole in the second insulating film to expose part of the first pad electrode layer, forming a metal plug in the first via hole, forming a second pad electrode layer on the second insulating film so that the first and second pad electrode layers are connected electronically by the metal plug, forming a second via hole from the back surface of the semiconductor substrate toward the first pad electrode layer, forming in the second via hole a penetrating electrode electrically connected with the first pad electrode layer, and cutting the semiconductor substrate to produce a semiconductor chip.

DETAILED DESCRIPTION OF THE INVENTION

Figure 19:
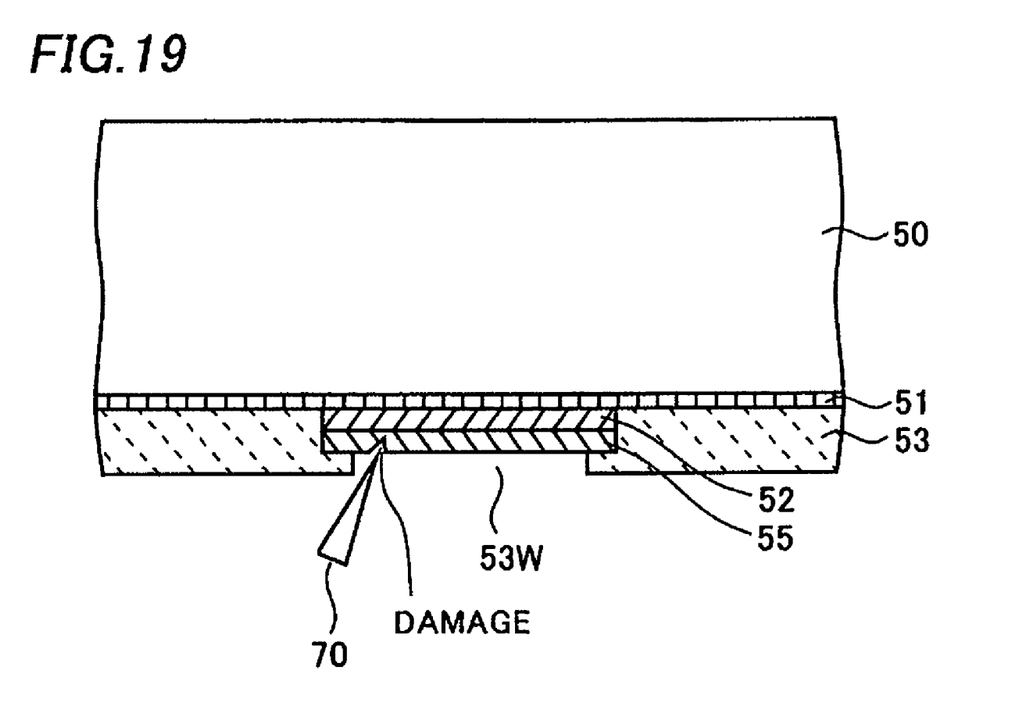
FIG. 19 is a cross sectional view of a manufacturing method of a semiconductor device of another embodiment.

FIG. 19 is a cross sectional view showing a manufacturing method of a semiconductor device of an embodiment of this invention. This embodiment also serves as a comparative example for the second embodiment of this invention.

A first pad electrode layer 52 is formed on the surface of a semiconductor substrate 50 with an electronic device not shown in the figure, which has been formed in the previous manufacturing process, with a first insulating film 51 between them, as shown in FIG. 19. Additionally, a second pad electrode layer 55 is also formed on the first pad electrode layer 52. A second insulating film 53 with an opening 53W exposing the second pad electrode 55 is disposed on a part of the second pad electrode layer 55 and the first insulating film 51.

A probe pin 70 will touch the surface of the second pad electrode layer 55 through the opening 53W on the surface of the semiconductor device during the circuit test of the electronic device not shown in the figure. However, the probe pin 70 occasionally damages the second pad electrode layer 55, when the probe pin 70 touches the second pad electrode layer 55, and the effect of the damage extends to the first pad electrode layer 52. For example, a scratch on the second pad electrode layer 55 reaches the first pad electrode layer 52.

Therefore, the first pad electrode layer 52 or the second pad electrode layer 55 are further damaged when the via hole, not shown in the figure, reaching the first insulating film 51 on the first pad electrode layer 52 from backside of the semiconductor substrate 50 is formed through the dry etching, the wet etching or the plasma etching, because the etching is concentrated on the damage on the first pad electrode layer 52.

Also, the proper connection between the penetrating electrode and the first pad electrode layer 52 is not maintained in some cases after the penetrating electrode that made of, for example copper (Cu), not shown in the figure, is formed inside the via hole including the damaged first pad electrode layer 52. That is, the reliability of the semiconductor device with a penetrating electrode is deteriorated, leading to the low reliability and yield rate of the semiconductor device with the penetrating electrode.

Next, the manufacturing method of the semiconductor device of a second embodiment of this invention will be explained by referring to figures. FIGS. 1-16 are cross sectional views showing the manufacturing method of the semiconductor device of the embodiment. FIGS. 1-16 shows the area of semiconductor substrate near the dicing line not shown in the figures.

Figure 1:
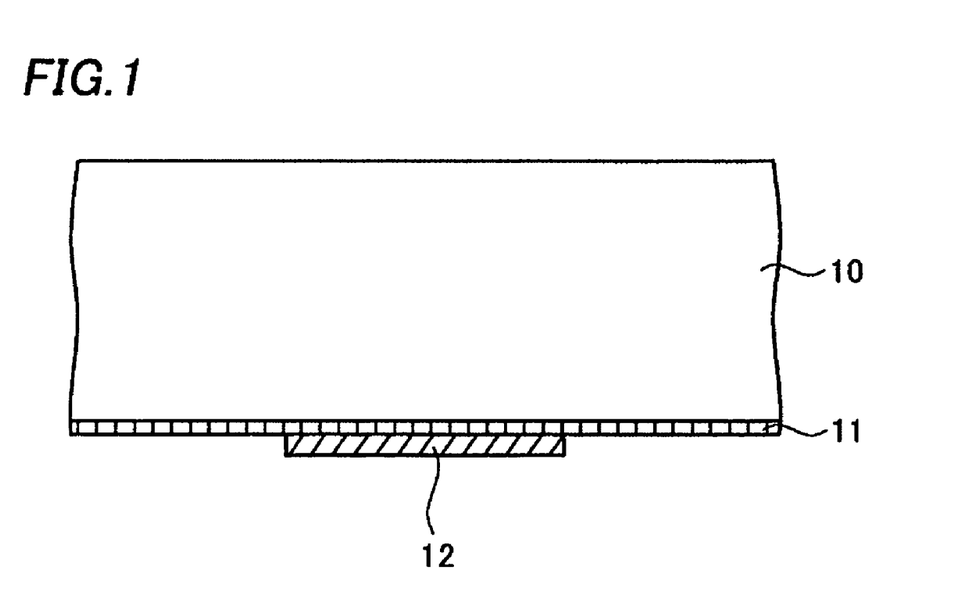
FIGS. 1-16 are cross sectional views of a manufacturing method of a semiconductor device of an embodiment of the invention.

First, a semiconductor substrate 10 with an electronic device, not shown in the figure, on the surface is prepared as shown in FIG. 1. Here, the electronic device that is not shown in the figure can be, for example, a CCD (charge coupled device), an optical element such as infrared ray sensor, or a light emission element. Also, the electronic device not shown in the figure can be the electronic device other than the devices mentioned above. The semiconductor substrate is made of, for example silicon substrate. Using the semiconductor substrate made of other materials is also possible. The semiconductor substrate 10 has preferably a film thickness of about 130 μm.

Next, a first insulating film 11 is formed as an inter-layer insulating film on the surface of the semiconductor substrate 10 with an electronic device not shown in the figure. The first insulating film 11 is made of, for example P-TEOS film or BPSG film. The first insulating film is preferably formed through CVD method with the film thickness of 0.8 μm.

A first pad electrode layer 12 that is connected to the electronic device not shown in the figure and that is used for the connection with outside device is formed on the first insulating film 11 on the surface of the semiconductor substrate 10 in the next process. The first pad electrode layer 12 is made of, for example aluminum preferably with a film thickness of 1 μm-2 μm.

Figure 2:
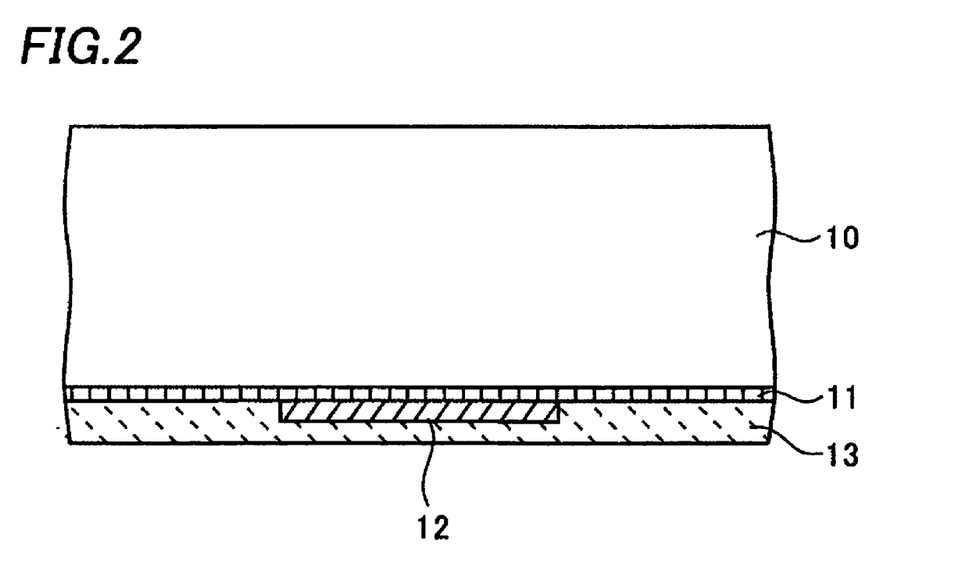

Next, a second insulating film 13 is disposed on the surface of the semiconductor substrate 10, that is, on the first pad electrode layer 12, covering the first pad electrode layer 12, as shown in FIG. 2. The second insulating film 13 is made of, for example silicon dioxide film ($SiO_2$ film) or silicon nitride film (SiN film) and manufactured through plasma CVD method. The second insulating film 13 has preferably a film thickness of 0.2 μm-1 μm.

Figure 3:
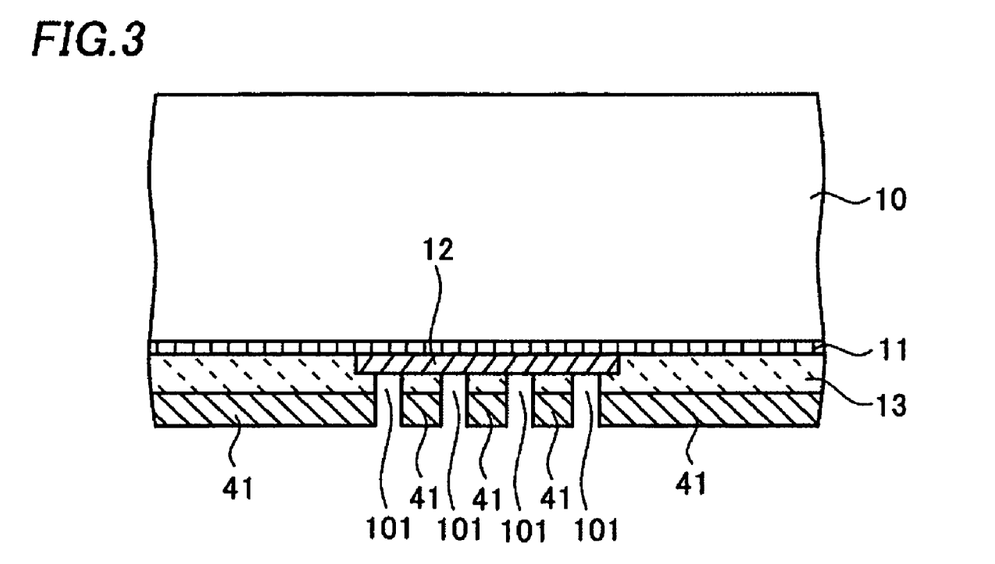

A first resist layer 41 is selectively formed in a predetermined area of the second insulating film 13, as shown in FIG. 3. The predetermined area on the second insulating film 13, on which the first resist layer 41 is formed, is the area except the area reserved for the first via holes, which will be formed on the first pad electrode layer 12.

Next, the first via hole 101 exposing the first pad electrode layer 12 through the partial opening of the second insulating film 12 is formed by selectively etching the second insulating layer 13 through preferably the dry etching using the first resist layer 41 as a mask, in the following process. The first pad electrode layer 12 is exposed at the bottom part of the first via hole 101.

The first via holes are preferably formed with a predetermined distance between them at the both end of the first pad electrode layer 12 or the adjusting area. Or, the first via hole 101 can be formed anywhere as long as it is on the first pad electrode layer 12. The first via hole 101 has preferably the diameter of 0.5 μm. The first resist layer 41 is removed upon the completion of the etching described above.

Figure 4:
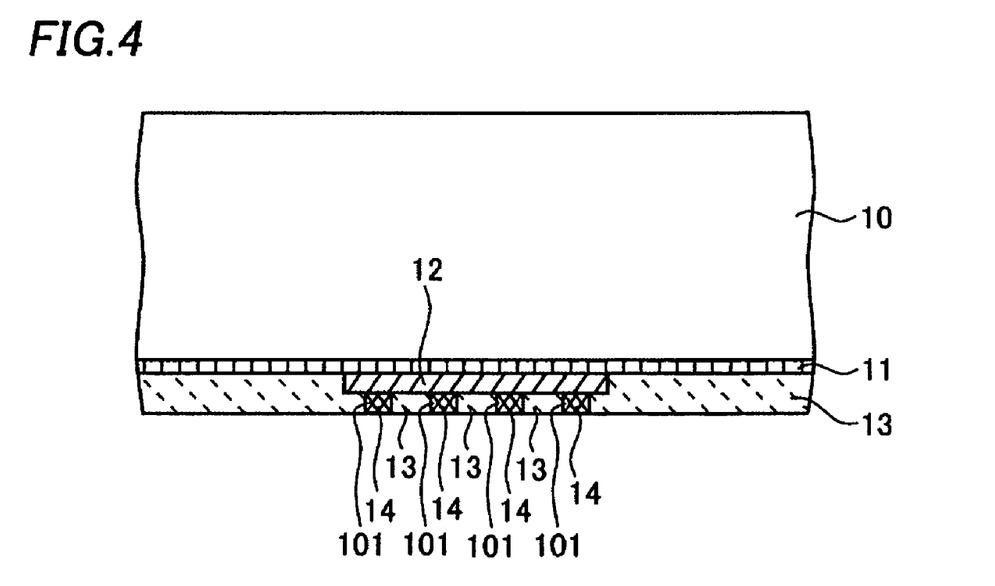

Then, a plug 14 made of a metal is formed inside the first via hole 101 as shown in FIG. 4. The plug 14 is buried into the first via hole till the surface of the plug reaches to the same level of the surface of the second insulating film 13. The plug 14 is preferably a metal plug made of tungsten (W) or a tungsten alloy. However, the plug 14 can be made of other metal. For example, the plug 14 can be made of high temperature aluminum (Al).

One of the forming methods of the plug 14 is a damascene method. That is, a metal layer made of, for example tungsten is first disposed on the entire surface of the second insulating film 13 including the first via hole 101. Then, this metal layer is polished through so-called CMP (chemical mechanical polishing) till the surface of the second insulating film 13 is exposed. The plug 14 with the configuration described above is formed in this way. It is also possible to form the plug 14 by using other methods.

Figure 5:
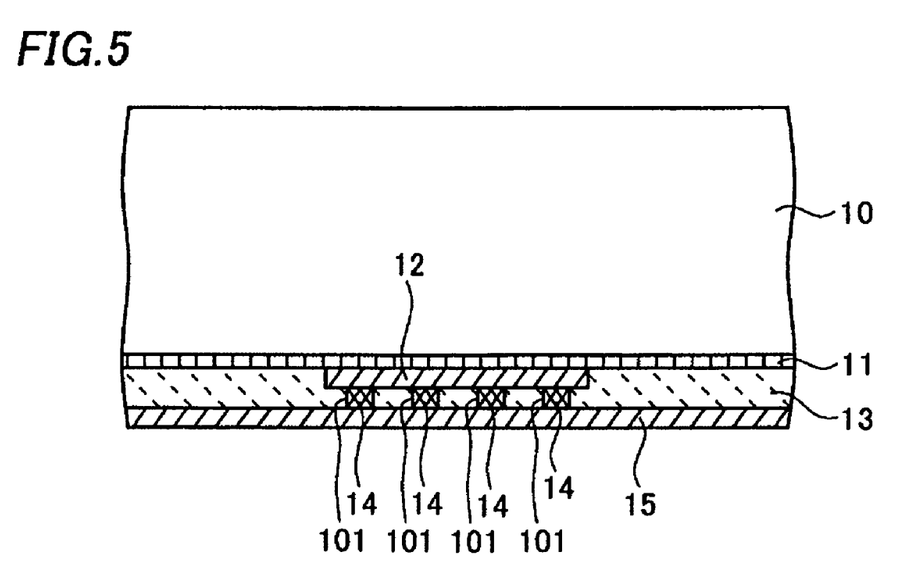

Next, a second pad electrode layer 15 is disposed on the entire surface of the second insulting film 13 including the plug 14, as shown in FIG. 5. Here, the second pad electrode layer 15 is electrically and mechanically connected to the first pad electrode layer 12 through the plug 14 of the first via hole 101. The second pad electrode layer 15 is made of, for example aluminum preferably with a film thickness of 0.3 μm-2 μm.

Figure 6:
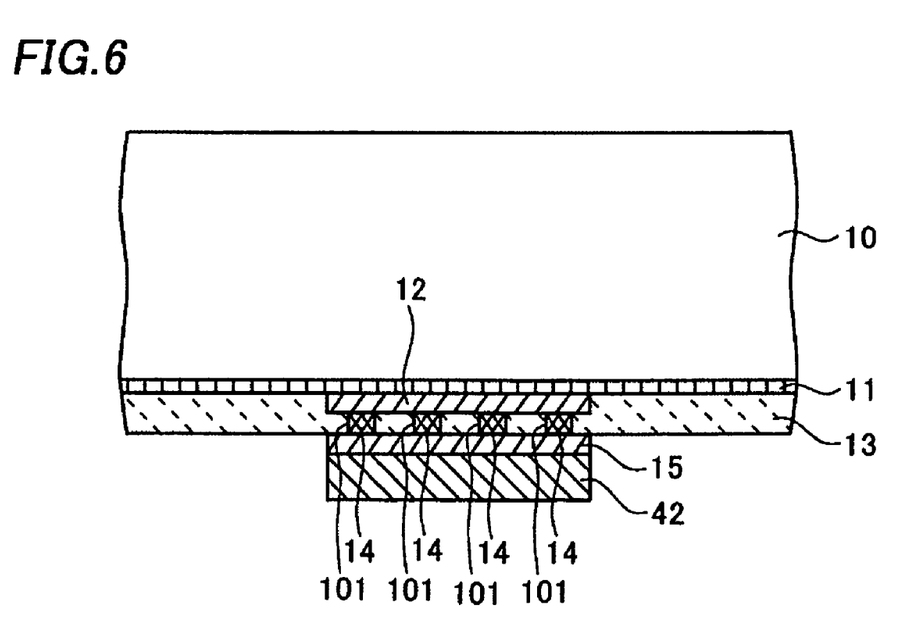

Then, the second resist layer 42 is selectively formed in a predetermined area on the second pad electrode layer 15, as shown in FIG. 6. The predetermined area on the second pad electrode layer 15 for the second resist layer 42 is the area covering the opening of the entire first via hole 101. The second resist layer 42 is disposed on the entire area where the first pad electrode 12 has been formed, as an example in this embodiment.

Next, the second pad electrode layer 15 is selectively etched preferably by the dry etching, using the second resist layer 42 as a mask. The etching process removes the unnecessary part, patterning the second pad electrode layer 15. The second resist layer 42 is then removed upon the completion of the etching process described above.

Figure 7:
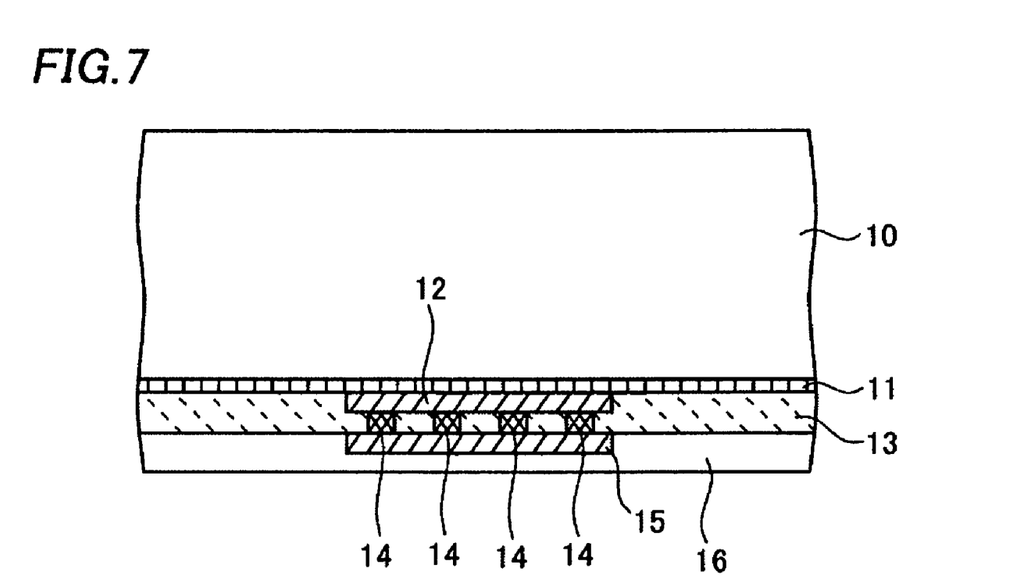

A first protecting layer 16 is formed on the second pad electrode layer 15 and the second insulting film 13 entirely covering the second pad electrode layer 15, as shown in FIG. 7. The first protecting layer 16 works as a passivation film, preferably made of silicon dioxide film ($SiO_2$ film) or silicon nitride film (SiN film).

Figure 8:
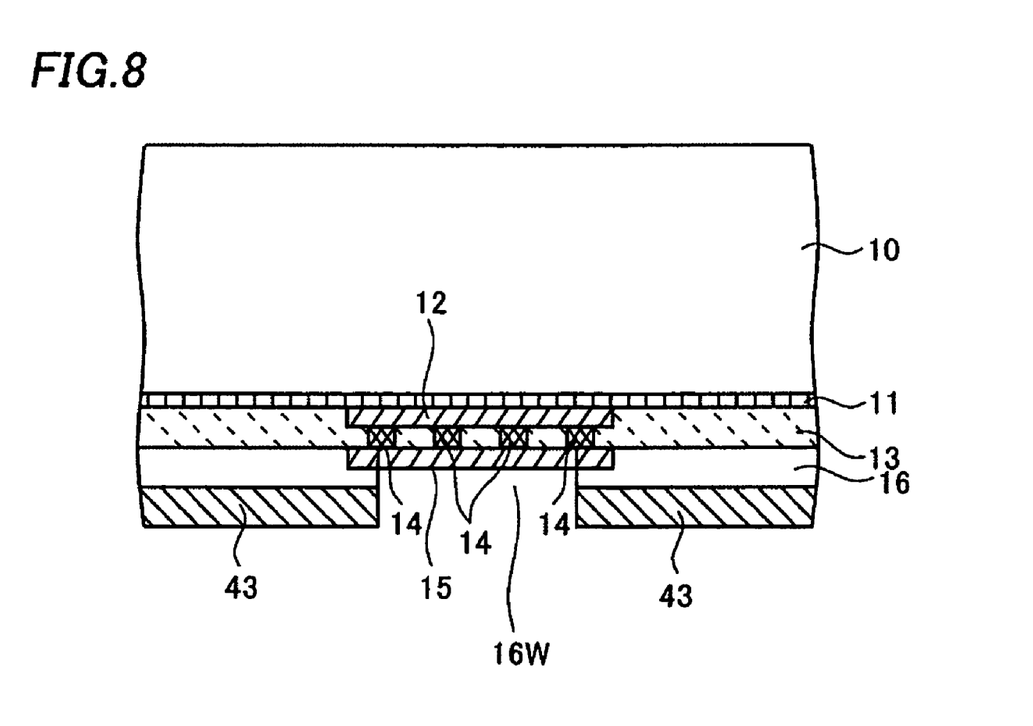

Next, a third resist layer 43 is selectively formed in a predetermined area of the first protecting layer 16, as shown in FIG. 8. The predetermined area on the first protecting layer 16, on which the third resist layer 43 is formed, is the area except the area reserved for the opening 16W. That is, the predetermined area includes a partial area on the second pad electrode layer 15 and the area other than the area for forming the second pad electrode layer 15.

Then, the etching, preferably the dry etching is performed on the first protecting layer with the third resist layer as a mask, forming the opening W16 exposing the second pad electrode layer 15. The third resist layer 43 is then removed upon the completion of the etching process described above. The second pad electrode layer 15 is used as the electrode touched by the probe pin during the circuit test of the semiconductor device through the opening 16W.

The first pad electrode layer 12 and the second pad electrode layer 15 are connected through the plug 14 in the first via hole 101 formed in the second insulating film 13 between the first and second pad electrode layers, as described above. The first pad electrode layer and the second pad electrode layer are separated in the manner described above. Therefore, the damage in the second pad electrode layer 15, which may be caused when the probe pin touches the second pad electrode layer 15 during the circuit test, has little effect on the first pad electrode layer 12 because the second insulating film 13 or the plug 14 works as a protecting layer or a buffer layer. That is, the damage to the first pad electrode layer 12 can be prevented as much as possible.

Figure 9:
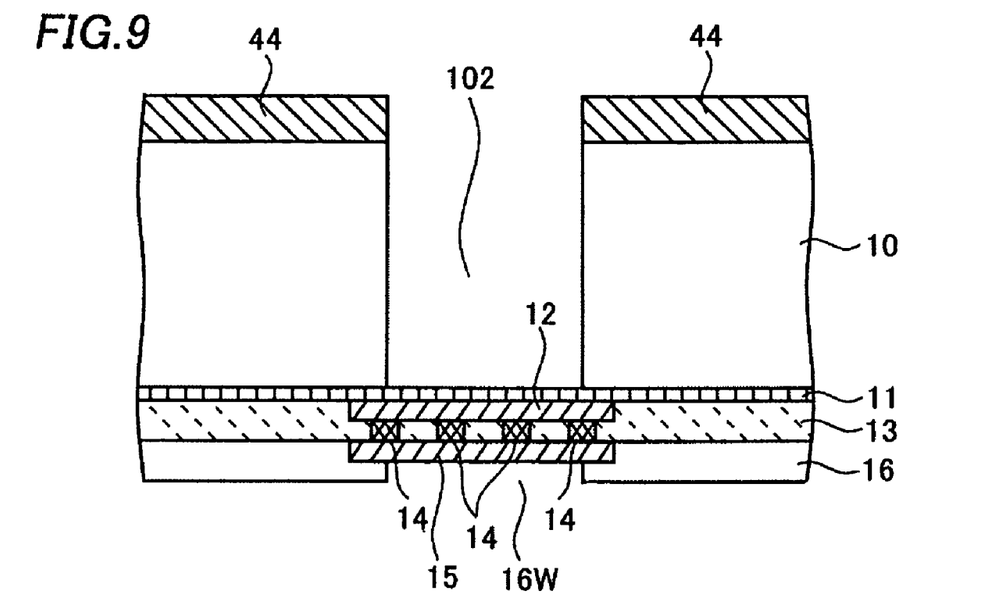

Next, a forth resist layer 44 is selectively formed on the backside of the semiconductor substrate 10, as shown in FIG. 9. The forth resist layer 44 is formed on the backside of the semiconductor substrate 10 in such way that the forth resist layer has an opening at the location corresponding to the first pad electrode layer 12.

The etching, preferably the dry etching, is performed on the semiconductor substrate 10 using the forth resist layer 44 as a mask. The gas containing $SF_6$, $O_2$ or $C_4F_8$ gas is used as the etching gas. The etching is preferably performed under the condition with the power of about 1.5 KW, the gas flow quantity of 300 sccm ($SF_6$) /30 sccm ($O_2$) and the pressure of 25 Pa, when the $SF_6$ and $O_2$ is used as the etching gas.

A second via hole 102 penetrating through the backside of the semiconductor substrate 10 reaching to the first pad electrode layer 12 is formed through the etching described above. The first insulating film 11 is exposed at the bottom of the second via hole 102.

There is no damage in the first pad electrode layer 12 due to the touching of the probe pin during the circuit test while the etching is performed. Therefore, the destruction of the first pad electrode layer 12 due to the penetration of the etching gas for the dry etching or the etching solution for the wet etching into the damaged area in the first pad electrode layer 12, which has been observed in the method of manufacturing the device of the first embodiment, can be prevented as much as possible.

Even if the second pad electrode layer 15 has been distorted upon the touching of the probe pin not shown in the figure during the circuit test performed before the second via hole 103 is formed, the distortion is eased by the insulating film 13 or the plug 14, leading to little effect on the first pad electrode layer 12. That is, the distortion of the first pad electrode layer 12 through the protrusion into the via hole can be prevented.

Figure 10:
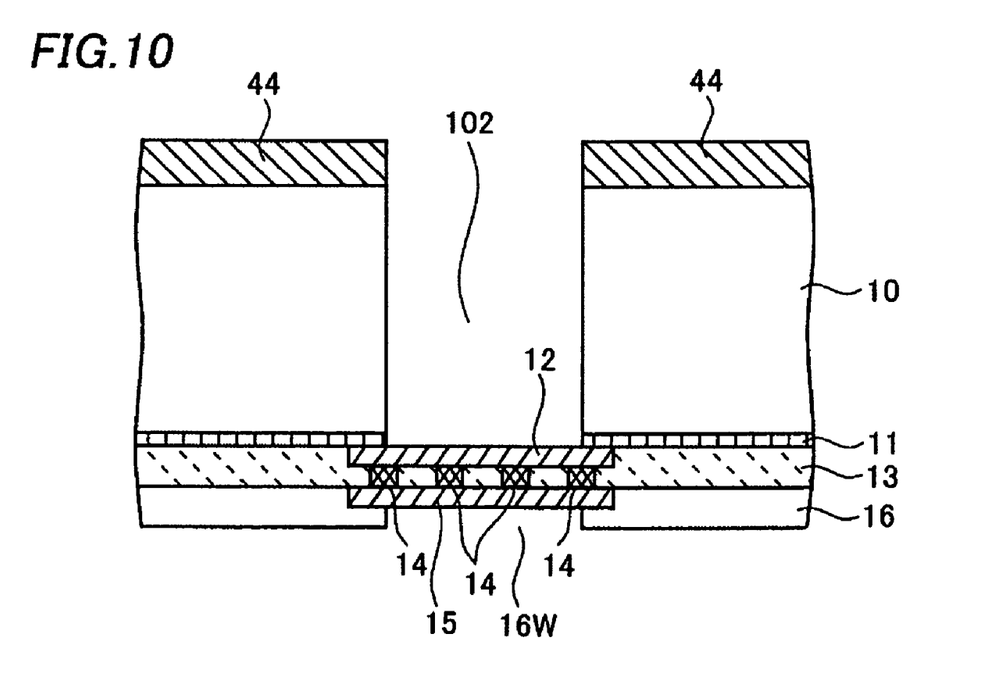

A part of the first insulating film 11 exposed at the bottom of the second via hole is selectively removed through the etching, preferably the dry etching using the forth resist layer 44 as a mask, as shown in FIG. 10. This process exposes a part of the first pad electrode layer 12 at the bottom of the second via hole 102. The forth resist layer 44 is removed after the etching process described above is completed.

Figure 11:
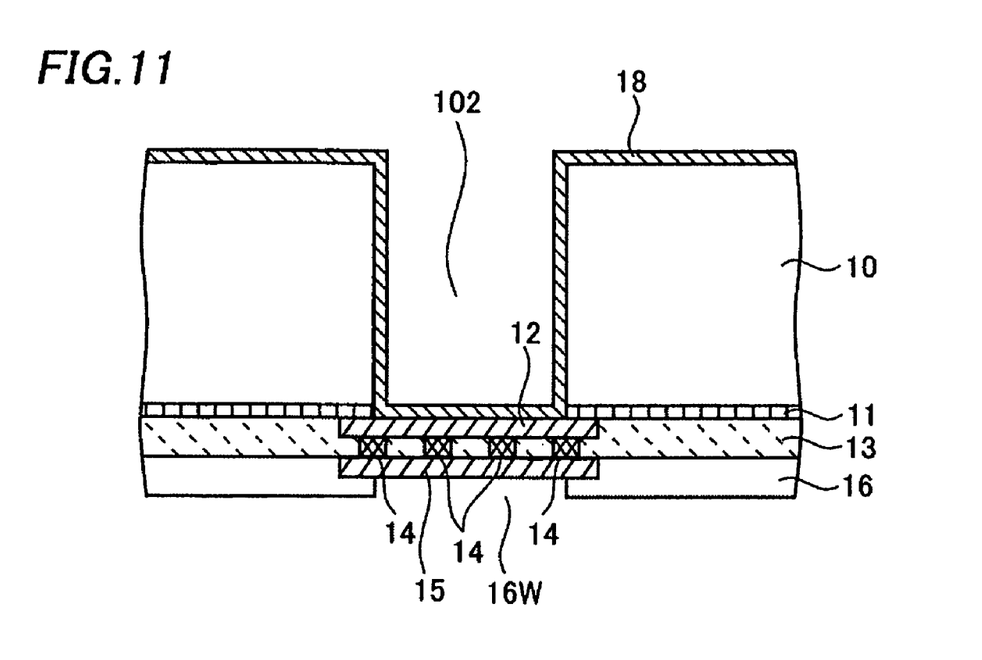

Next, a third insulating film 18 is formed on the entire backside of the semiconductor substrate 10 including the second via hole 102 as shown in FIG. 11. The third insulating film 18 is made of, for example silicon dioxide film ($SiO_2$ film) or silicon nitride film (SiN film) and manufactured through plasma CVD method. The third insulating film 18 has preferably a film thickness of 1 μm-2 μm.

Figure 12:
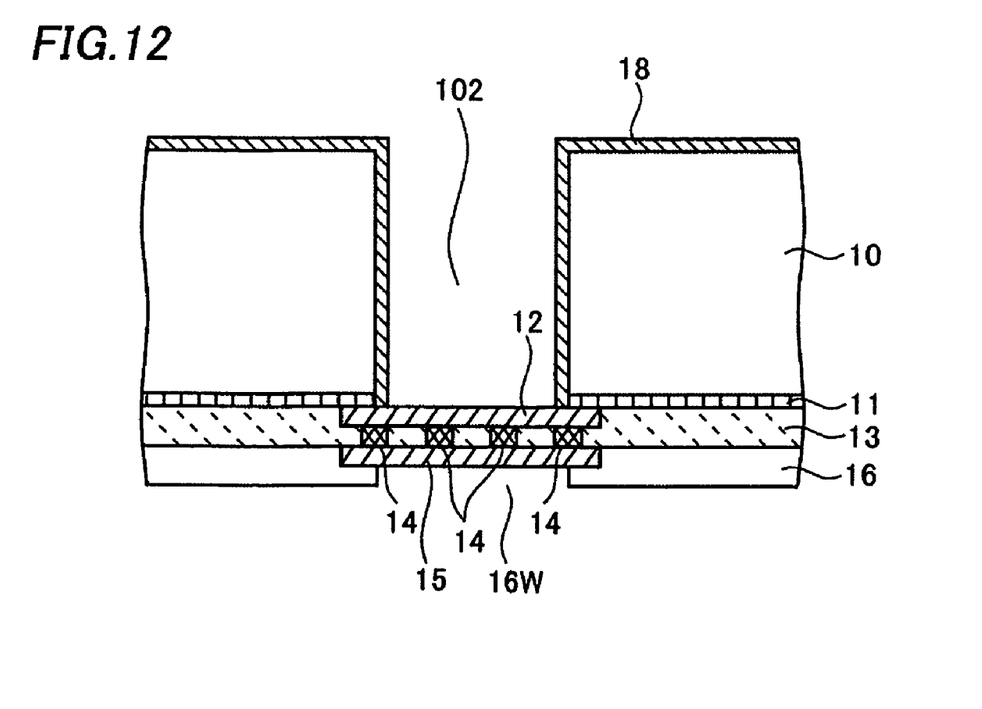

Then, the etching, preferably the anisotropic dry etching is performed on the third insulating film 18 from the backside of the semiconductor substrate 10, as shown in FIG. 12. The third insulating film 18 is formed in such way that the thickness of the third insulating film 18 at the bottom of the second via hole 102 is thinner than the thickness of the third insulating film 18 on the backside of the semiconductor substrate, corresponding to the depth of the second via hole 102. Therefore, the third insulating film 18 at the bottom of the second via hole 102 is removed exposing a part of the first electrode layer 12 through the etching described above, while the third insulating film 18 on the side wall of the second via hole 102 and the backside of the semiconductor substrate remains.

Figure 13:
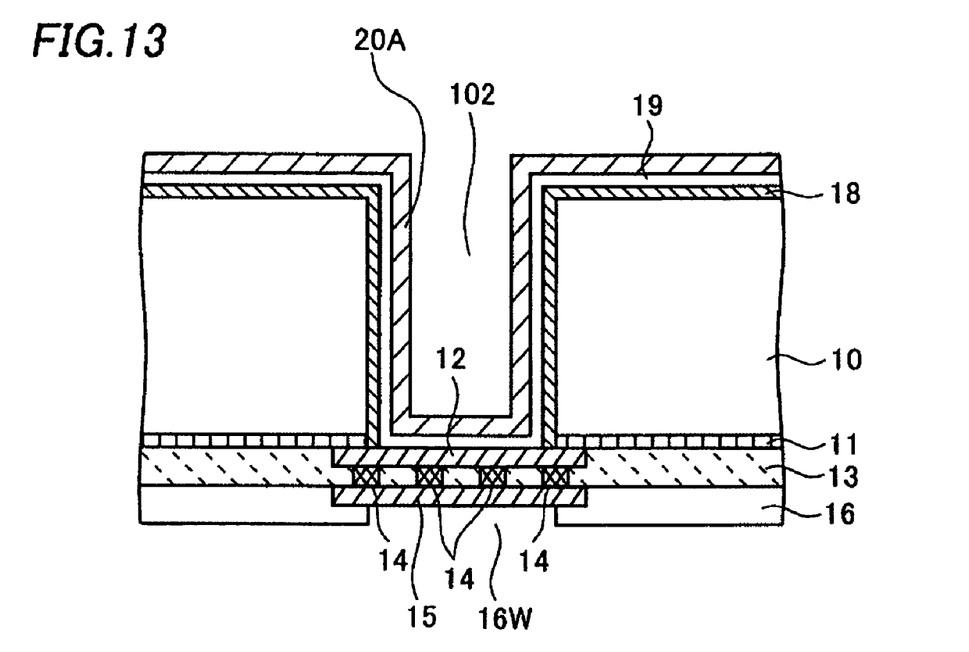

A barrier metal layer 19 is disposed in the following process inside the second via hole 102 and on the third insulating layer 18 on the backside of the semiconductor substrate 10, as shown in FIG. 13. The barrier metal layer 19 is made of, for example, a titan tungsten (TiW) layer, a titan nitride (TiN) layer, or a tantalum nitride (TaN) layer.

The barrier metal layer 19 is formed by spattering method, CVD method, non-electrolytic plating method, or other film forming methods. Then, a seed layer, not shown in the figure, is disposed on the barrier metal layer. The seed layer works as an electrode when a wiring layer 20A described below is formed by plating, and is made of metal such as copper (Cu).

The forming of the barrier metal layer 19 can be omitted when the third insulating film 18 on the side of the second via hole 102 is made of silicon nitride film (SiN film), because the silicon nitride film (SiN film) works as a barrier against the diffusion of copper.

A wiring layer 20A is disposed covering the barrier metal layer 19 and the seed layer disposed in the semiconductor substrate 10 in the next process. The wiring layer 20A is a metal layer made of, for example copper (Cu), formed by non-electrolytic plating method.

Figure 14:
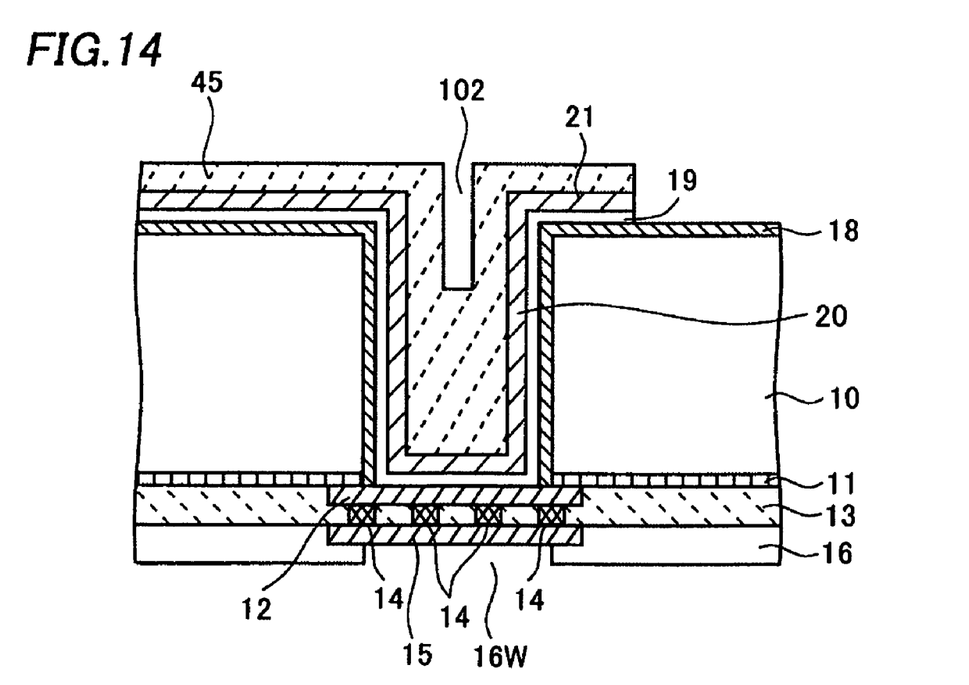

Then, a fifth resist layer 45 is formed on a predetermined area of the wiring layer 20A, as shown in FIG. 14. A penetrating electrode 20 and a wiring layer 21 adjacent to and electrically connected to the penetrating electrode 20 are formed by patterning the wiring layer 20A using the fifth resist layer 45 as a mask. The thickness of the plating film is adjusted in such way that the penetrating electrode 20 does not completely fill the second via hole 102. It is also possible to form the penetrating electrode 20 completely filling the second via hole 102. The predetermined area for forming the fifth resist layer 45 is the area on the backside of the semiconductor substrate 10 including the area reserved for forming the second via hole 102 and the area reserved for forming the wiring layer 21 with a predetermined pattern described later.

The penetrating electrode 20 is electrically connected to the first pad electrode 12 exposed at the bottom of the second via hole 102 through the seed layer and the barrier metal layer 19. Also, the wiring layer 21 adjacent to the penetrating electrode 20 is formed with a predetermined pattern on the backside of the semiconductor substrate 10 with the seed layer and the barrier metal layer 19 between them. Then, the patterning removal is performed on the barrier metal layer 19 using the wiring layer 21 and the seed layer as a mask after the fifth resist layer 45 is removed.

Also, the penetrating electrode 20 and the wiring layer 21 can be formed in separate processes. The method of forming of the penetrating electrode 20 and the wiring layer 21 is not limited to the electrolytic plating method using copper (Cu), described above. They can be formed through other film making methods using other metals as well. For example, the material for the penetrating electrode 20 and the wiring layer 21 can be aluminum (Al) or an aluminum alloy, and the penetrating electrode 20 and the wiring layer 21 can be formed by spattering method. In this manufacturing method, the penetrating electrode and the wiring layer made of the metal mentioned above are formed by spattering method on the barrier metal layer after a barrier metal layer, not shown in the figure, is disposed on the back side of the semiconductor substrate including the second via hole 102. Then, a resist layer, not shown in the figure, is formed in a predetermined area including the area reserved for forming the second via hole 102 on the wiring layer. The patterning is performed on the wiring layer using the resist layer as a mask. Or, the penetrating electrode 20 and the wiring layer 21 can be formed by CVD method.

Figure 15:
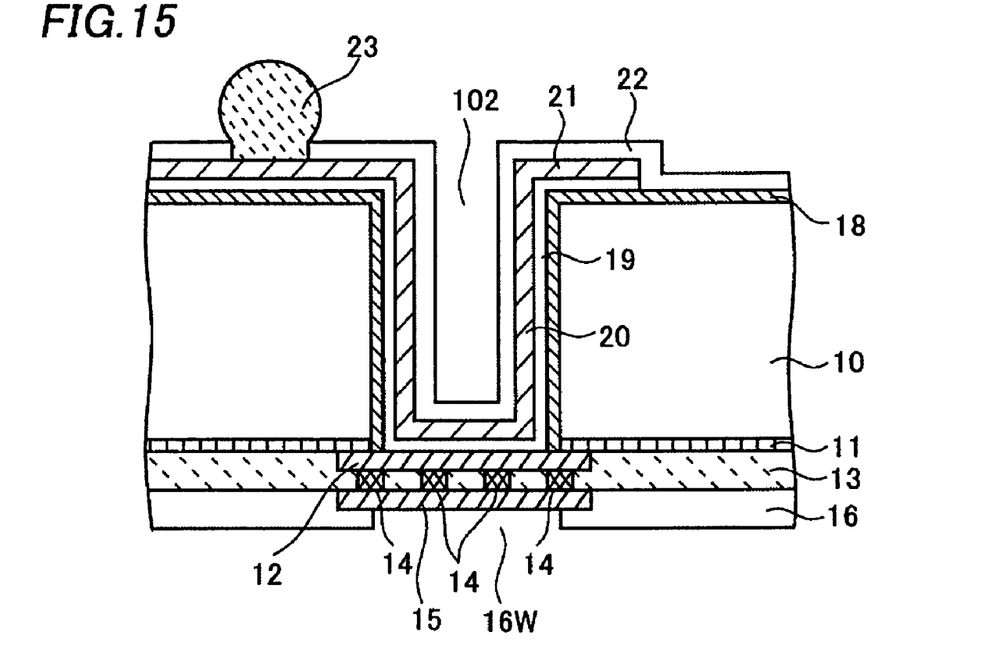

Next, a second protecting layer 22 is disposed on the backside of the semiconductor substrate 10 including the second via hole 102 covering the barrier metal layer 19, the penetrating electrode 20 and the wiring layer 21, as shown in FIG. 15. The second protecting layer 22 is made of, for example a resist material. An opening is provided in the second protecting layer 22 at the location corresponding to the wiring layer 21. A ball-shaped conductive terminal 23 made of, for example a solder is placed on the area of wiring layer exposed through the opening in the second protecting layer 22.

Figure 16:
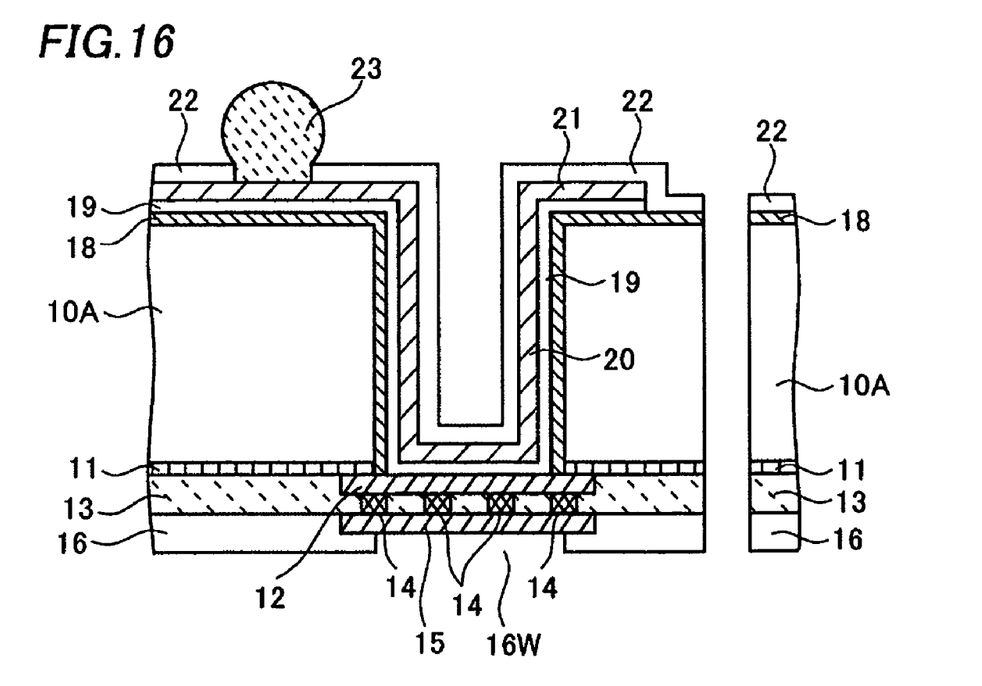

Next, the semiconductor substrate 10 is diced as shown in FIG. 16 along the dicing line not shown in the figure. This completes the manufacturing of a plurality of semiconductor devices configured from the semiconductor chips 10A with the penetrating electrode 20.

According to the semiconductor device and its manufacturing method of this embodiment, the damage in the second pad electrode layer 15, which may be caused when the probe pin touches the second pad electrode layer 15 during the circuit test, has little effect on the first pad electrode layer 12 because the second insulating film 13 or the metal plug 14 works as a protecting layer or a buffer layer. That is, the destruction of the first pad electrode layer 12 due to the damage mentioned above can be prevented as much as possible.

The distortion of the second pad electrode layer 15 towards the backside of the semiconductor chip 10A (the semiconductor substrate 10), which may be caused when the probe pin touches the second pad electrode layer 15, has little effect on the first pad electrode layer 12 because the second insulating film 13 or the metal plug 14 can ease the distortion. That is, the distortion of the first pad electrode layer 12 towards the via hole can be prevented as much as possible.

The first pad electrode layer 12 and the second pad electrode layer 15 are connected to the second insulating film 13 respectively, preventing the distortion of the second pad electrode layer 15. Therefore, the improper connection between the penetrating electrode 20 and the first pad electrode layer 12 at the bottom of the second via hole 102 can be prevented, improving the reliability regarding the connection between the penetrating electrode 20 and the first pad electrode layer 12.

The first pad electrode layer 12 can be used for the connection with the penetrating electrode 20 and the second pad electrode layer 15 can be used for the connection with the probe pin, keeping the proper function of each pad electrode layer. As a result, the reliability and yield rate of the semiconductor device with the penetrating electrode can be improved.

Although the second pad electrode layer 15 exposed at the opening 16W is designated as the electrode used for the connection with the probe pin, not shown in the figures, during the circuit test, this embodiment is not limited to that configuration. For example, it is possible to form a conductive terminal, not shown in the figures, on the second pad electrode layer 15 exposed through the opening 16W. Other semiconductor device can be layered over the semiconductor device with the conductive terminal described above, establishing the electrical connection between them.

The conductive terminal 23 is not necessarily formed in the embodiment of this embodiment. That is, forming of the conductive terminal 23 can be omitted as long as the electrical connection of the penetrating electrode 20 and the wiring layer 21 to the circuit substrate not shown in the figures is established. For example, the conductive terminal 23 is not necessarily formed on the wiring layer 21 partially exposed from the protecting layer 22 when the semiconductor device is a LGA (Land Grid Array) type.

The wiring layer 21 is not necessarily formed in the embodiment of this embodiment. That is, form of the wiring layer 21 can be omitted when the penetrating electrode 20 is formed completely buried in the second via hole 102. For example, the penetrating electrode 20 can be directly connected to the circuit substrate, not shown in the figures, not through the wiring layer 21 or the conductive terminal 23. Or, the penetrating electrode 20 can be connected to the circuit substrate, not shown in the figures, through the conductive terminal 23 formed on the penetrating electrode 20 exposed at the second via hole 102.

Figure 17:
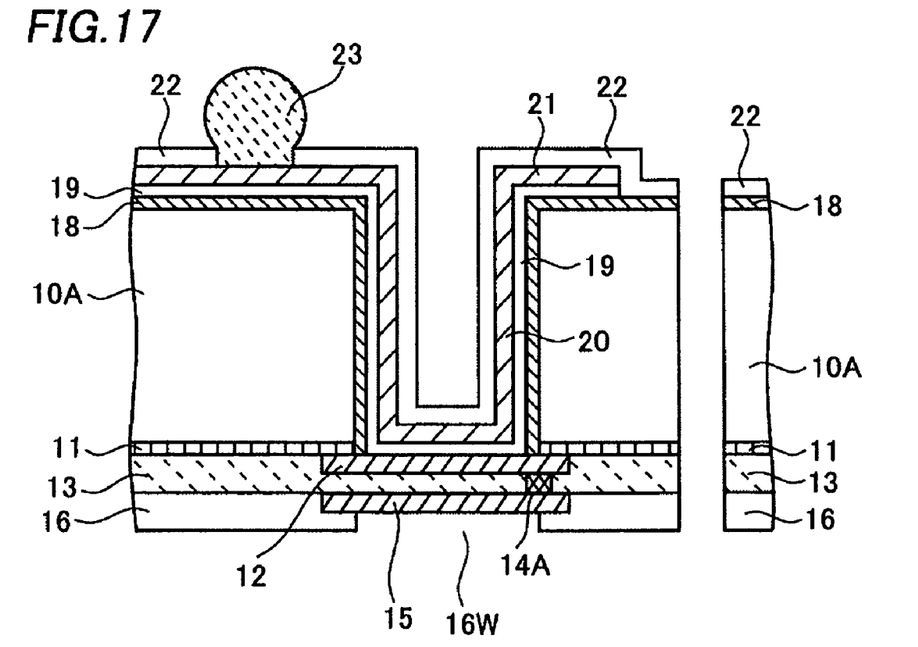
FIGS. 17 and 18 are cross sectional views of the semiconductor device of the embodiment of the invention.
Figure 18:
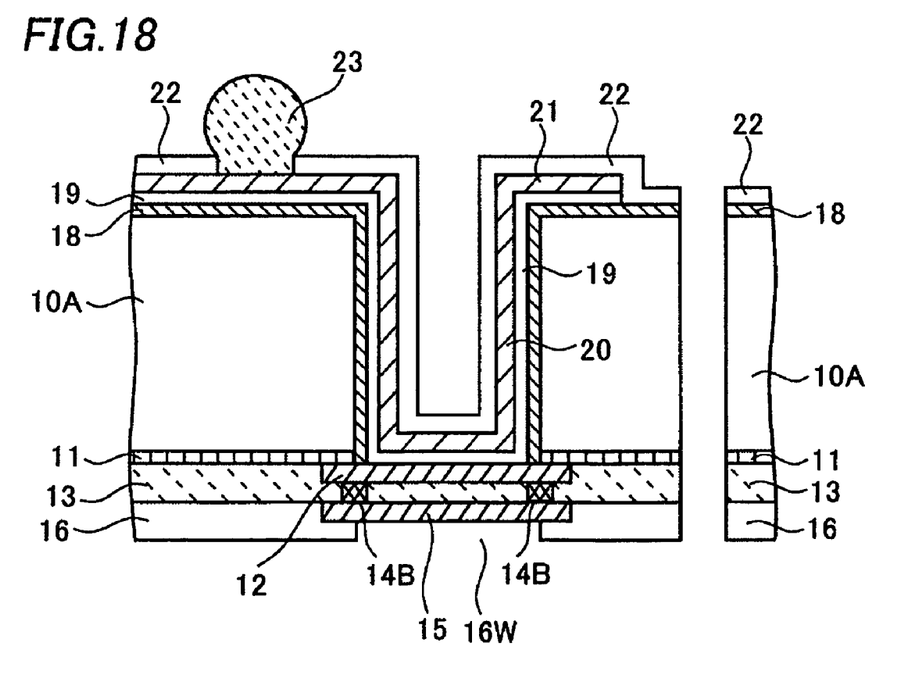

Although more than three plugs 14 are formed with a predetermined distance from each other in the second insulating film 13 formed between the first pad electrode layer 12 and the second pad electrode layer 15 in the embodiment described above, the embodiment is not limited to this configuration. The plug can be formed as shown in FIGS. 17 and 18. FIGS. 17 and 18 are the cross sectional views of the semiconductor device of two modifications of the embodiment.

That is, one plug 14A making contact with the first pad electrode layer 12 and the second pad electrode layer 15 at one end of those layers can be formed in the second insulating film 13 as shown in FIG. 17. Also, two plugs 14B making contact with the first pad electrode layer 12 and the second pad electrode layer 15 at both ends of those layers can be formed in the second insulating film 13 as shown in FIG. 18. Both plug 14A and the plug 14B are not formed in the central area of the first and second pad electrode layers 12 and 15, where the probe pin makes frequent touches.

Since the area, where the first pad electrode layer 12 and the second pad electrode layer 15 are contacted with the second insulating film 13, covers the region where the probe pin makes frequent touches, the damage and the distortion of the second pad electrode layer 15 has no effect on the first pad electrode layer 12. The distortion of the pad electrode layers can be prevented because the adherence between the first and the second pad electrode layers is improved.

What is claimed is:

1. A semiconductor device comprising:
   a semiconductor substrate comprising a first insulating film disposed on a front surface thereof;
   a first pad electrode layer disposed on part of the first insulating film;
   a second insulating film disposed on the first pad electrode layer and having a first via hole;
   a second pad electrode layer disposed on the second insulating film;
   a metal plug disposed in the first via hole and electrically connecting the first and second pad electrode layers;
   a penetrating electrode disposed in a second via hole and electrically connected to the first pad electrode layer, the second via hole being formed from a back surface of the semiconductor substrate toward the first pad electrode layer;
   a first protecting layer disposed on the second insulating film;
   a wiring layer disposed on the back surface and electrically connected to the penetrating electrode; and
   a second protecting layer disposed on the back surface to cover at least part of the wiring layer, wherein the first pad electrode layer covers one end of the second via hole formed in the semiconductor substrate so as to close the one end, the first protecting layer covers a portion of the second pad electrode layer and leaves another portion of the second pad electrode layer exposed, and a conductive terminal is disposed on a part of the wiring layer not covered by the second protecting layer and is away from the second via hole in a direction parallel to the front surface of the semiconductor substrate.

2. The semiconductor device of claim 1, wherein the second pad electrode layer covers said one end of the second via hole so that the first pad electrode layer is disposed between the second via hole and the second pad electrode layer.

3. A semiconductor device comprising:

a semiconductor substrate comprising a first insulating film disposed on a front surface thereof;

a first pad electrode layer disposed on part of the first insulating film;

a second insulating film disposed on the first pad electrode layer and having a first via hole;

a second pad electrode layer disposed on the second insulating film;

a metal plug disposed in the first via hole and electrically connecting the first and second pad electrode layers;

a penetrating electrode disposed in a second via hole and electrically connected to the first pad electrode layer, the second via hole being formed from a back surface of the semiconductor substrate toward the first pad electrode layer;

a first protecting layer disposed on the second insulating film;

a wiring layer disposed on the back surface and electrically connected to the penetrating electrode; and a second protecting layer disposed on the back surface to cover at least part of the wiring layer, wherein the first pad electrode layer covers one end of the second via hole formed in the semiconductor substrate so as to close the one end, the first protecting layer covers a portion of the second pad electrode layer and leaves another portion of the second pad electrode layer exposed, the second protecting layer extends into the second via hole so as to cover the penetrating electrode at said one end of the second via hole, and the penetrating electrode is disposed between a sidewall of the second via hole and the second protecting layer.

4. A semiconductor device comprising:

a semiconductor substrate comprising a first insulating film disposed on a front surface thereof and having a via hole penetrating the semiconductor substrate and the first insulating film so as to have an end at the front surface of the semiconductor substrate;

a first pad electrode layer disposed on the first insulating film so as to close the end of the via hole;

a second insulating film disposed on the first pad electrode layer and having a hole;

a second pad electrode layer disposed on the second insulating film so as to overlap with the first pad electrode layer so that the hole of the second insulating film is placed between overlapping portions of the first and second pad electrode lagers;

a metal plug disposed in the hole of the second insulating film and electrically connecting the first and second pad electrode layers;

a penetrating electrode disposed in the via hole of the semiconductor substrate so as to be electrically connected to the first pad electrode layer; and a first protecting layer disposed on the second insulating film so as to cover a portion of the second pad electrode layer and to leave another portion of the second pad electrode layer exposed, wherein the second pad electrode protrudes from the second insulating film.

5. The semiconductor device of claim 4, further comprising a second protecting layer that is insulating and disposed in the via hole so that the penetrating electrode lies between the second protecting layer and a sidewall of the via hole.

6. A semiconductor device comprising:

a semiconductor substrate having a via hole formed therein so as to connect a front surface of the substrate and a back surface of the substrate;

a pad electrode layer covering the via hole and comprising a first pad electrode layer, a second pad electrode layer and an insulating film disposed between the first and second pad electrode layers;

more than one metal plugs formed in the insulating film and electrically connecting the first and second pad electrode layers;

a penetrating electrode disposed in the via hole so as to be electrically connected to the first pad electrode layer;

a first protecting layer disposed on the insulating film so as to cover a portion of the second pad electrode layer and to leave another portion of the second pad electrode layer exposed, and a second protecting layer that is insulating and disposed in the via hole so that the penetrating electrode lies between the second protecting layer and a sidewall of the via hole.

* * * * *